United States Patent [19]

Takeuchi et al.

[11] Patent Number: 5,376,856

[45] Date of Patent: Dec. 27, 1994

[54] PIEZOELECTRIC/ELECTROSTRICTIVE ACTUATOR HAVING CERAMIC SUBSTRATE WITH AUXILIARY WINDOWS IN ADDITION TO PRESSURE CHAMBER WINDOWS

[75] Inventors: Yukihisa Takeuchi, Aichi; Hideo Masumori, Anjo; Katsuyuki Takeuchi, Nagoya, all of Japan

[73] Assignees: NGK Insulators, Ltd.; Seiko Epson Corp., both of Japan

[21] Appl. No.: 199,606

[22] Filed: Feb. 22, 1994

[30] Foreign Application Priority Data

Feb. 23, 1993 [JP] Japan .................. 5-059670

[51] Int. Cl.$^5$ .......................... H01L 41/08
[52] U.S. Cl. .................... 310/328; 310/330; 310/331; 347/68
[58] Field of Search .............. 310/357–359, 310/328, 330–332; 346/140 R, 1.1, 75

[56] References Cited

U.S. PATENT DOCUMENTS

| | | |
|---|---|---|
| 3,747,120 | 7/1973 | Stemme .................... 346/75 |
| 3,946,398 | 3/1976 | Kyser et al. ................ 346/1 |
| 4,680,595 | 7/1987 | Cruz-Uribe et al. ......... 346/140 |
| 5,289,209 | 2/1994 | Suzuki et al. ............... 346/140 R |
| 5,301,404 | 4/1994 | Ochiai et al. ............... 346/140 R X |
| 5,311,218 | 5/1994 | Ochiai et al. ............... 310/333 X |
| 5,311,219 | 5/1994 | Ochiai et al. ............... 310/328 X |

FOREIGN PATENT DOCUMENTS

5-246025  9/1993  Japan .

*Primary Examiner*—Mark O. Budd
*Attorney, Agent, or Firm*—Parkhurst, Wendel & Rossi

[57] ABSTRACT

A piezoelectric/electrostrictive actuator including a ceramic substrate and piezoelectric/electrostrictive elements is disclosed. The ceramic substrate includes: a spacer plate having a plurality of windows formed in a row in the longitudinal direction of the spacer plate, and auxiliary windows formed adjacent to respective two outermost windows which are located at the opposite ends of the row of the plurality of windows, such that the auxiliary windows sandwich the row of the plurality of windows; and a closure plate superposed on one of opposite major surfaces of the spacer plate, so that the plurality of windows and the auxiliary windows of the spacer plate are closed by the closure plate to provide pressure chambers and enclosed spaces, respectively, within the substrate. The spacer plate and the closure plate are formed from respective ceramic green sheets which are laminated on each other and fired into an integral structure as the ceramic substrate. The piezoelectric/electrostrictive elements are disposed on respective portions of the closure plate which partially define the pressure chambers, respectively, but are not disposed on respective portions of the closure plate which partially define the enclosed spaces corresponding to the auxiliary windows.

13 Claims, 6 Drawing Sheets

PIEZOELECTRIC/ELECTROSTRICTIVE ACTUATOR HAVING CERAMIC SUBSTRATE WITH AUXILIARY WINDOWS IN ADDITION TO PRESSURE CHAMBER WINDOWS

BACKGROUND OF THE INVENTION

1. Field of the Invention

The present invention relates in general to a piezoetectric/electrostrictive actuator, and more particularly to a uni-morph, bi-morph or other types of piezoelectric/electrostrictive actuators or actuator units which undergo displacement in the form of bending, deflection or flexure and which can be used for ink jet print heads, microphones, sounding bodies (such as loudspeakers), various resonators and vibrators, and other components or devices.

2. Discussion of the Related Art

As a means for raising a pressure in a pressure chamber formed within a substrate of an actuator unit, there is recently known a piezoelectric/electrostrictive element formed on a wall partially defining the pressure chamber, for changing a volume of the pressure chamber due to displacement of the piezoelectric/electrostrictive element. Such a piezoelectric or electrostrictive actuator unit may be used for each of a plurality of ink pumps of a print head used in an ink jet printer, for example. To effect printing by the print head, an ink material is supplied to the pressure chamber to fill the same, and the level of ink pressure within the pressure chamber is raised due to displacement of the piezoelectric/electrostrictive element, so that a droplet of the ink is jetted through a nozzle which communicates with the pressure chamber.

Figure 5:
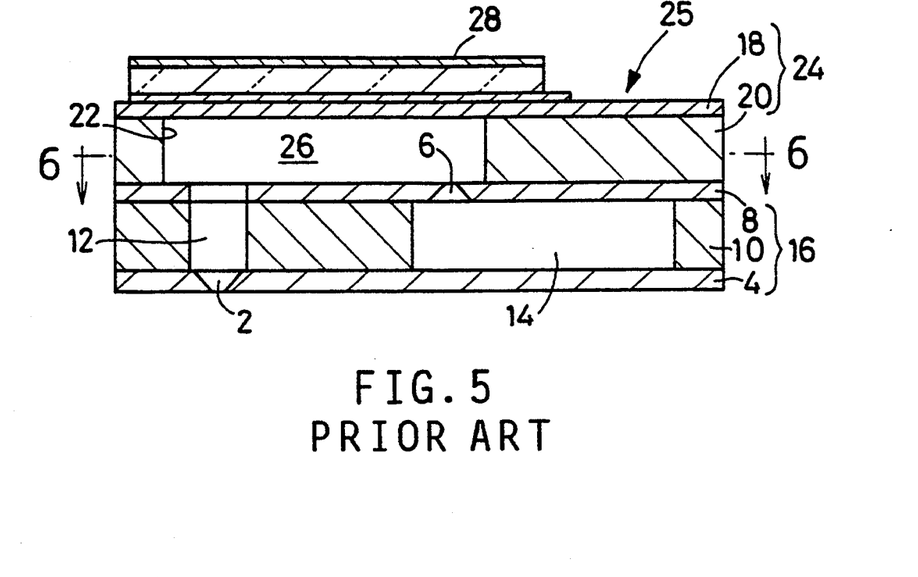
FIG. 5 is an elevational view in vertical cross section, showing one example of a conventional actuator unit for an ink jet print head.
Figure 6:
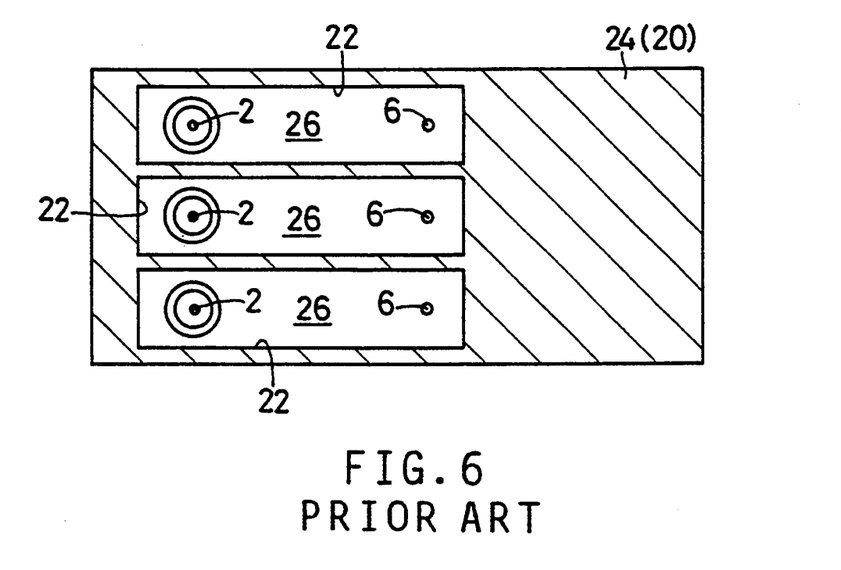
FIG. 6 is a cross sectional view taken along line 6—6 of FIG. 5.

Referring to FIGS. 5 and 6, there is illustrated one of the actuator units used in an ink jet print head, wherein the reference numeral 25 denotes an actuator portion which includes a substrate 24 consisting of a closure plate 18 and a spacer plate 20 both made of a metal, synthetic resin or ceramic material, and a plurality of piezoelectric/electrostrictive elements 28 formed on an outer surface of the closure plate 18 of the substrate 24. The spacer plate 20 has an array of windows 22 (three windows in this example) formed through its thickness. The spacer plate 20 and the closure plate 18 are superposed on each other and formed integrally into the substrate 24, so that one of opposite openings of each window 22 is closed by the closure plate 18, thereby to provide, within the substrate 24, a plurality of pressure chambers 26 which correspond to the respective windows 22. The piezoelectric/electrostrictive elements 28 are secured to the outer surface of the closure plate 18 of the substrate 24 such that the piezoelectric/electrostrictive elements 28 are aligned with the respective pressure chambers 26. In operation, the piezoelectric/electrostrictive elements 28 are actuated to cause deformation and resulting volumetric change of the pressure chambers 26 for changing the pressure within the pressure chambers 26.

Each actuator unit of the ink jet print head further has an ink nozzle member 16, as shown in FIGS. 5 and 6, which consists of a metallic nozzle plate 4 having a plurality of nozzles 2, a metallic orifice plate 8 having a plurality of orifices 6, and a channel plate 10, which are superposed on each other such that the channel plate 10 is interposed between the plates 4, 8. These plates 4, 8, 10 are bonded together into the ink nozzle member 16, so as to form ink discharge holes 12 and an ink supply channel 14. The plurality of nozzles 2 communicate with the respective pressure chambers 26 of the actuator portion 25 through the respective ink discharge holes 12 formed within the ink nozzle member 16, while the plurality of orifices 6 communicate with the respective pressure chambers 26 of the actuator 25, and also with the ink supply channel 14 formed within the ink nozzle member 16.

The ink nozzle member 16 and the actuator portion 25 are superposed on each other, and bonded together into an integral structure of the actuator unit. Generally, an ink jet print head uses many actuator units arranged side by side. In such ink jet print head, the actuator portion 25 of each actuator unit used as an ink pump is adapted to deform the pressure chambers 26 for changing the pressure therein, based on the actuation of the piezoelectric/electrostrictive elements 28, so that droplets of the ink material in the pressure chambers 26 are jetted or discharged through the appropriate nozzles 2 to effect printing. As an attempt to provide an ink jet print head which is capable of performing highly accurate and high-quality printing, a modified form of the actuator unit is proposed, wherein a relatively large number of pressure chambers 26 are formed within the substrate 24 of the actuator portion 25 at a relatively small pitch, and a correspondingly large number of nozzles 2 are formed through the nozzle plate 4.

The actuator portion 25 of each actuator unit constructed as described above, however, has suffered from a problem in terms of the operating characteristics of the piezoelectric/electrostrictive elements 28. That is, among the plurality of piezoelectric/electrostrictive elements 28 which are formed in a row on the substrate 24 so as to correspond to the respective pressure chambers 26, two outermost elements 28 which are located at the opposite ends of the row are inferior in the operating characteristics to the other or two inner elements 28 interposed therebetween. More specifically described, the amount of flexural deformation of each piezoelectric/electrostrictive element 28 of the actuator portion 25 constructed as described above was measured by applying a suitable voltage to each of the elements 28. The result of the measurement shows that the amounts of flexural deformation of the above-indicated two outermost elements 28 are considerably small, that is, the amounts of flexural deformation of the two outermost elements 28 are smaller by about 30 per cent as compared to those of the inner elements 28 interposed between the two elements. A variation or fluctuation in the amount of flexural deformation or inconsistent operating characteristics of the piezoelectric/electrostrictive elements 28 of the actuator portion 25 undesirably causes inconsistency or fluctuation in the ink-jetting capability of the print head and deterioration of the quality of printed images produced by the print head, when the above-constructed actuator units are used as the ink pumps for the ink jet print head.

SUMMARY OF THE INVENTION

It is therefore an object of the present invention to provide a piezoelectric/electrostrictive actuator which includes a ceramic substrate having a plurality of pressure chambers formed in a row extending in its longitudinal direction, and a plurality of piezoelectric/electrostrictive elements which are formed in a row on the outer surface of the substrate and which correspond to the respective pressure chambers, wherein the operating characteristics of the two outermost piezoelectric-/electrostrictive elements which are located at the opposite ends of the row are effectively improved, so that all the piezoelectric/electrostrictive elements of the actuator exhibit excellent operating characteristics.

The above object may be accomplished according to the principle of the present invention which provides a piezoelectric/electrostrictive actuator comprising: a ceramic substrate in which pressure chambers are formed, the ceramic substrate including a spacer plate having a plurality of windows which provide the pressure chambers, the plurality of windows being formed in a row in a longitudinal direction of the spacer plate, and a closure plate superposed on one of opposite major surfaces of the spacer plate, for closing one of opposite openings of each of the windows, the spacer plate and the closure plate being formed from respective ceramic green sheets which are laminated on each other and fired into an integral structure as the ceramic substrate; and piezoelectric/electrostrictive elements which are disposed on respective portions of the closure plate which partially define the pressure chambers, respectively, the elements being energized to cause deformation of the respective portions, so as to change pressure levels of the corresponding pressure chambers, each of the piezoelectric/electrostrictive elements comprising a pair of electrodes and a piezoelectric/electrostrictive layer, which are formed by a film-forming method on an outer surface of the closure plate, such that the piezoelectric/electrostrictive layer is interposed between the pair of electrodes, wherein the improvement comprises: the spacer plate of the ceramic substrate having auxiliary windows formed adjacent to respective two outermost windows which are located at opposite ends of the row of the plurality of windows of the spacer plate, such that the auxiliary windows sandwich the row of the plurality of windows, the auxiliary windows providing enclosed spaces within the ceramic substrate such that the enclosed spaces are formed adjacent to respective two outermost pressure chambers which are located at opposite ends of a row of the pressure chambers, each of the enclosed spaces being partially defined by portions of the closure plate on which the piezoelectric/electrostrictive elements are not disposed.

In the piezoelectric/electrostrictive actuator constructed as described above, a plurality of pressure chambers corresponding to the respective windows of the spacer plate are formed within the ceramic substrate in a row extending in the longitudinal direction of the substrate, while enclosed spaces or cavities corresponding to the respective auxiliary windows are also formed within the substrate, such that the enclosed spaces are formed adjacent to respective two outermost pressure chambers which are located at the opposite ends of the row of the pressure chambers, such that the enclosed spaces sandwich the plurality of pressure chambers. This arrangement is effective to reduce the rigidity of the two outermost pressure chambers located at both ends of the row, whereby the two pressure chambers are more likely to be deformed. Accordingly, all of the piezoelectric/electrostrictive elements corresponding to the respective pressure chambers undergo substantially the same amount of flexural deformation, whereby all the piezoelectric/electrostrictive elements exhibit excellent operating characteristics with high stability. Therefore, when the piezoelectric/electrostrictive actuator as described above is used as each of actuator units or ink pumps for an ink jet print head, for example, the ink jet print head exhibits excellent ink-jetting capability owing to the improved operating characteristics of the piezoelectric/electrostrictive elements. Thus, the ink jet print head using the present actuator is capable of producing improved quality of printed images with high stability.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENT

Figure 1:
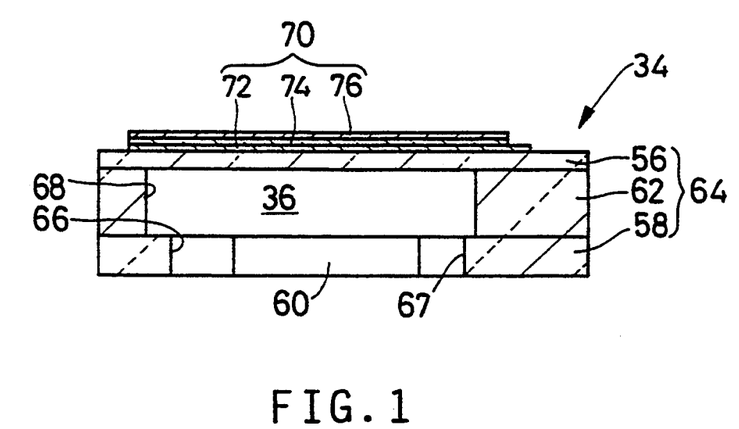
FIG. 1 is an elevational view in vertical cross section, showing a piezoelectric/electrostrictive actuator portion of an actuator unit according to one embodiment of the present invention.
Figure 2:
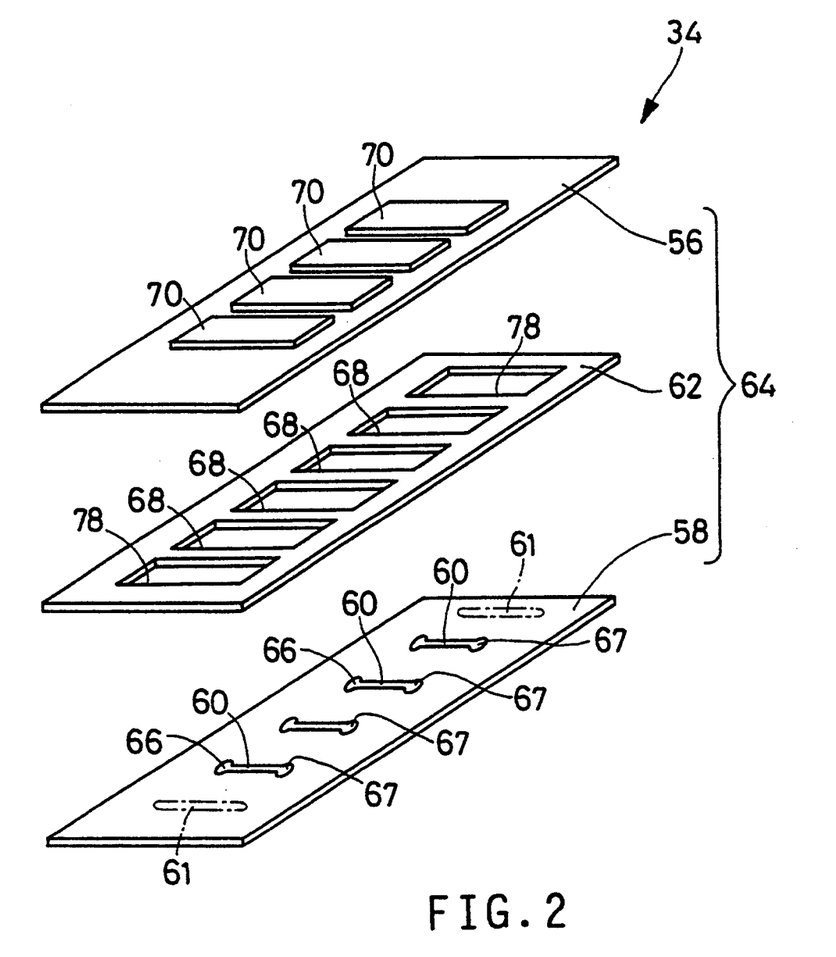
FIG. 2 is an exploded perspective view showing the structure of the piezoelectric/electrostrictive actuator portion of FIG. 1.

Referring first to FIG. 1 schematically showing a piezoelectric/electrostrictive actuator portion 34 of an actuator unit according to one embodiment of the present invention, and to FIG. 2 which is an exploded perspective view of the actuator portion 34, the actuator portion 34 includes a ceramic substrate 64 consisting of a closure plate 56, a spacer plate 62, and a connecting plate 58 each having a relatively small thickness and formed of a ceramic material. These plates 56, 62, 58 are superposed on each other and formed integrally into the ceramic substrate 64. The actuator portion 34 further includes a plurality of piezoelectric/electrostrictive elements 70 formed in the form of films on the outer surface of the closure plate 56. The piezoelectric/electrostrictive elements 70 undergo displacement in the form of bending or flexure upon application of a voltage thereto, and the displacement causes deformation or strain of the appropriate pressure chambers formed within the ceramic substrate 64 so as to change a pressure level in each of the pressure chambers 36.

More specifically described referring to FIG. 2, the spacer plate 62 of the ceramic substrate 64 has four inner rectangular windows 68 formed through the thickness thereof. The inner windows 68 are formed in a row in equally spaced-apart relation with each other in the longitudinal direction of the spacer plate 62, as viewed in a plane of the spacer plate 62. The spacer plate 62 further has two auxiliary or outer windows 78, 78 each having substantially the same dimensions and configuration as those of the windows 68. The auxiliary windows 78, 78 are formed adjacent to respective two outermost ones of the inner windows 68, which are located at the opposite ends of the row of the four inner windows 68, such that the auxiliary windows 78 sandwich the four inner windows 68 therebetween. The connecting plate 58 of the ceramic substrate 64 has four pairs of first and second communication holes 66, 67 which are formed through the thickness thereof. Each pair of the first and second communication holes 66, 67 is aligned with the corresponding one of the inner windows 68, as viewed in a plane of the connecting plate 58. The connecting plate 58 further has slits 60 formed therethrough for connecting the first and second communication holes 66, 67 of each pair.

The connecting plate 58 is bonded to one of opposite major surfaces of the spacer plate 62 (more precisely, the lower surface of the spacer plate 62 as seen in FIG. 2), and the closure plate 56 is bonded to the other major surface of the spacer plate 62 (more precisely, the upper surface of the spacer plate 62 as seen in FIG. 2), so that these superposed plates 56, 58, 62 provide an integral structure of the ceramic substrate 64. In the thus formed ceramic substrate 64, the four inner windows 68 and the two auxiliary or outer windows 78 of the spacer plate 62 are closed at opposite openings thereof by the closure plate 56 and the connecting plate 58. According to this arrangement, four pressure chambers 36 corresponding to the respective four inner windows 68 are formed within the ceramic substrate 64, such that the pressure chambers 36 are arranged in a row extending in the longitudinal direction of the ceramic substrate 64, as viewed in a plane of the substrate 64. Each of the pressure chambers 36 is held in communication with exterior space through the corresponding pair of the first and second communication holes 66, 67. Further, in the ceramic substrate 64 constructed as described above, two enclosed spaces or cavities corresponding to the two auxiliary windows 78 are formed adjacent to the two outermost pressure chambers of the four pressure chambers, which are located at the opposite ends of the row of the four pressure chambers 36, such that the two enclosed spaces sandwich the four pressure cheers 36 therebetween. The enclosed spaces defined by the auxiliary outer windows 78 of the spacer plate 62, closure plate 58 and connecting plate 58 have suitably designed dimensions and configuration, e.g., substantially the same volume as the pressure chambers 36, in this embodiment.

The ceramic substrate 64 as described above is formed as a fired integral ceramic structure in the following manner. Initially, a ceramic slurry is prepared from ceramic materials, binders, liquid solvents and other materials, and the thus prepared ceramic slurry is formed into green sheets by means of a generally used device such as a doctor blade device or a reverse roll coater. Then, the obtained green sheets are subjected to suitable mechanical machining operation or laser machining operation such as cutting, machining or punching, as needed, to form the windows 68 and the first and second communication holes 66, 67. Thus, precursors for the plates 56, 58, 62 are formed. These precursors are laminated on each other and co-fired into the integrally formed ceramic substrate 64. The thus formed ceramic substrate 64 assures complete and secure sealing between the adjacent plates 56, 58, 62, without applying any adhesive to their interfaces.

For establishing more stable sealing between the plates 56, 58, 62, it is preferable to print or coat a slurry or paste formed of the same materials as the slurry of the green sheets, at the interfaces of the green sheets for the plates 56, 58, 62 before firing, thereby to form surface layers at the interfaces of the green sheets. The thus formed surface layers are softer than the green sheets, and therefore, are likely to be spread over the entire surface of the green sheets under a pressure when the green sheets for the plates 56, 58, 62 are laminated and pressed onto each other, so that the surface layers provide sufficient bonding strength and assure increased and stable sealing tightness at the interfaces of the plates 56, 58, 62 in the fired ceramic substrate 64.

In the ceramic substrate 64 constructed as described above, the pressure chambers 36 formed therein are held in communication With the exterior space through the respective pairs of the first and second communication holes 66, 67 of the connecting plate 58. This arrangement of the ceramic substrate 64 is favorable upon bonding of the ceramic substrate 64 of the actuator portion 34 to an ink nozzle member 32 (FIG. 3) or other component which will be described, since a sealing area between the substrate 64 of the actuator portion 34 and the ink nozzle member 32 which must be sealed fluid-tightly is significantly reduced, thereby assuring improved bonding efficiency. Further, the provision of the connecting plate 58 assures improved structural strength of the ceramic substrate 64, which favorably prevents warpage of the ceramic substrate 64 upon firing thereof, and permits easy handling of the substrate 64 while the actuator portion 34 is manufactured or used in the print head. It is noted that the slits 60 formed through the thickness of the connecting plate 58 are effective to reduce the rigidity of the ceramic substrate 64, so as to obtain a sufficient amount of deformation of the pressure chambers 36 formed within the substrate 64. For the same reason, it is desirable to form additional slits 61 having substantially the same dimensions and configuration as the slits 60, at the portions of the connecting plate 58 which correspond to the respective auxiliary windows 78, as shown in FIG. 2. Since the enclosed spaces defined by the auxiliary windows 78, closure plate 56 and connecting plate 58 are air-tightly closed, there arises a pressure difference between the inside of the enclosed spaces and the exterior space because of a difference in temperature between the inside of the enclosed spaces and the exterior space, upon firing the ceramic substrate 64. This pressure difference will give an adverse effect on the ceramic substrate 64, in view of the structural strength thereof. Accordingly, in case that the slits 61 as described above are not formed in the connecting plate 58, it is preferable to form suitable communication holes at the portions of the connecting plate 58 corresponding to the respective auxiliary windows 78.

While the ceramic material for forming the ceramic substrate 64 is not particularly limited, alumina, zirconia or the like may be preferably employed in view of its high formability and other desired properties. Further, the closure plate 56, connecting plate 58 and spacer plate 62 are preferably formed from green sheets having substantially the same ceramic composition and distribution of grain size, so as to achieve good sinterability and matching of coefficients of the thermal expansion of the plates 56, 58, 62.

In the ceramic substrate 64 as described above, the thickness of the closure plate 56 is preferably 50 $\mu m$ or smaller, more preferably, 20 μm or smaller, still more preferably, in a range of about 3–12 μm. The thickness of the spacer plate 62 is preferably 10 μm or larger, more preferably, 50 μm or larger. The thickness of the connecting plate 58 is preferably 30 μm or larger, more preferably, 50 μm or larger, most preferably, 100 μm or larger.

The piezoelectric/electrostrictive elements 70 each consisting of a lower electrode 72, piezoelectric/electrostrictive layer 74 and an upper electrode 76 are formed on the outer surface of the closure plate 56 in alignment with the respective pressure chambers 36, by a film forming method. On the portions of the outer surface of the closure plate 58 which correspond to the two auxiliary or outer windows 78, however, the piezoelectric/electrostrictive elements 70 are not formed. As the elements 70 used in the present embodiment, it is particularly preferable to employ piezoelectric/electrostrictive elements as proposed in U.S. patent application Ser. No. 07/912,920 having an assignee in common with those of the present patent application.

The electrode films (upper and lower electrodes 76, 72) and the piezoelectric/electrostrictive layer 74 are formed on the outer surface of the closure plate 56, by any one of various known film-forming methods which include thick-film forming techniques such as screen printing, spraying, dipping and coating, and thin-film forming techniques such as ion-beam method, sputtering, vacuum vapor deposition, ion plating, CVD and plating. The films and layer 72, 74, 76 may be formed either before or after firing of the closure plate 58 (ceramic substrate 64).

When the films 72, 74, 76 of the piezoelectric/electrostrictive elements 70 are formed and fired after the ceramic substrate 64 is fired, the elements 70 tend to suffer from residual strains due to a difference in thermal contraction between the material of the ceramic substrate 64 and the material for the piezoelectric/electrostrictive elements 70. In the present actuator portion 34, however, since the pressure chambers 36 are more likely to be deformed because of the slits 60 formed through the connecting plate 58 of the substrate 64, the residual strains as described above can be favorably reduced.

The upper and lower electrodes 76, 72 and the piezoelectric/electrostrictive layer 74 formed on the closure plate 56 may be heat-treated as needed, either in different steps following formation of the respective films and layer 76, 72, 74, or concurrently in one step following formation of all of the films and layer 76, 72, 74.

The upper and lower electrode films 76, 72 of each piezoelectric/electrostrictive element 70 may be formed of any electrically conductive material which can withstand a high-temperature oxidizing atmosphere generated upon the heat-treatment or firing as described above. For instance, the electrode films 76, 72 may be formed of a single metal, an alloy, a mixture of a metal or alloy and an electrically insulating ceramic or glass, or an electrically conductive ceramic. The piezoelectric/electrostrictive layer 74 of each piezoelectric/electrostrictive element 70 may be formed of any piezoelectric or electrostrictive material which produces a relatively large amount of strain or displacement due to the converse or reverse piezoelectric effect or the electrostrictive effect. The piezoelectric/electrostrictive material may be either a crystalline material or an amorphous material, and may be a semi-conductor material or a dielectric or ferroelectric ceramic material. Further, the piezoelectric/electrostrictive material may either require a treatment for initial polarization or poling, or may not require such a polarization treatment.

The piezoelectric/electrostrictive element 70 constructed as described above generally has a thickness of not larger than 100 μm. The thickness of each of the upper and lower electrode films 76, 72 is generally 20 μm or smaller, preferably 5 μm or smaller. To assure a relatively large amount of displacement by application of a relatively low voltage, the thickness of the piezoelectric/electrostrictive layer 74 is preferably 50 μm or smaller, more preferably, in a range of 3 μm to 40 μm.

The piezoelectric/electrostrictive elements 70, which are supported by the closure plate 56 of the ceramic substrate 64, exhibit sufficiently high mechanical strength and toughness even though the elements 70 have a relatively small thickness. In addition, the film-forming method used for forming the electrode films 76, 72 and the piezoelectric/electrostrictive layer 74 permits a relatively large number of the piezoelectric/electrostrictive elements 70 to be formed on the closure plate 56. That is, in the film-forming process as described above, the elements 70 can be concurrently and easily formed with a small spacing left between the adjacent ones, without using an adhesive or the like.

The above-described piezoelectric/electrostrictive elements 70 are formed integrally on the ceramic substrate 64, so as to constitute the intended piezoelectric or electrostrictive actuator portion 34 of the actuator unit. In the thus formed actuator portion 34, in addition to the four pressure chambers 36 (corresponding to the four inner windows 68) formed within the ceramic substrate 64 in a row extending in the longitudinal direction of the substrate 64, the two enclosed spaces (corresponding to the auxiliary or outer windows 78) are formed within the substrate 64 adjacent to the respective two outermost pressure chambers 36, which are located at the opposite ends of the row of the four pressure chambers 36, such that the two enclosed spaces sandwich the four pressure chambers 36 therebetween. The provision of the enclosed spaces formed as described above is effective to reduce the rigidity of the two outermost pressure chambers, whereby the two outermost pressure chambers 36 are more likely to be deformed. Accordingly, each of the four piezoelectric/electrostrictive elements 70 corresponding to the respective four pressure chambers 36 undergoes the substantially same amount of displacement, whereby excellent operating characteristics are assured with high stability for all the piezoelectric/electrostrictive elements. Upon firing the piezoelectric/electrostrictive elements 70 formed on the closure plate 56, the elements 70 may suffer from thermal stresses due to thermal contraction generated while the piezoelectric/electrostrictive material for the elements 70 is sintered and densified. The elements 70 may further suffer from thermal stresses caused due to a difference in coefficients of thermal expansion between the piezoelectric/electrostrictive material and the ceramic material for the closure plate 56 partially defining the pressure chambers 36. The stresses as mentioned above undesirably deteriorate the operating characteristics of the two outermost piezoelectric/electrostrictive elements 70 which correspond to the two outermost pressure chambers 36 located on the opposite ends of the row of the pressure chambers 36. In the present actuator portion 34 wherein the auxiliary windows 78 are formed as described above, however, the deterioration of the operating characteristics in the two outermost elements is favorably eliminated or reduced.

Figure 3:
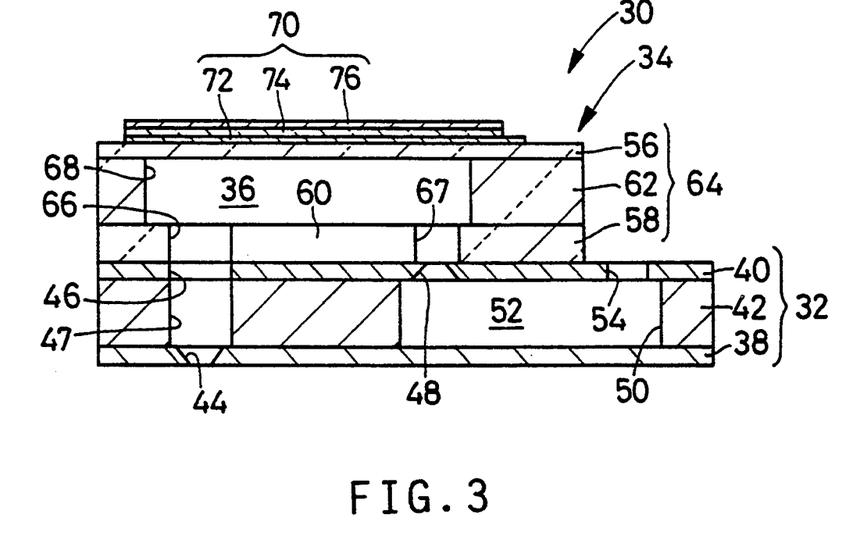
FIG. 3 is an elevational view in vertical cross section, showing the actuator unit including the actuator portion of FIG. 1, which actuator unit is used in an ink jet print head.

The actuator portion 34 as described above can be used for each of ink pumps or actuator units used in an ink jet print head, for instance. Referring to FIG. 3 schematically showing an actuator unit 30 constructed according to the present invention, in which the above-indicated ink nozzle member 32 and the actuator portion 34 as described above are bonded together to form an integral structure of the actuator unit indicated generally at 30 in FIG. 4. The ink nozzle member 32 consists of a nozzle plate 38 and an orifice plate 40 both having a relatively small thickness, and a channel plate 42 interposed between these plates 38, 40. The nozzle plate 38 and the orifice plate 40 are integrally bonded to the channel plate 42 by means of an adhesive.

Figure 4:
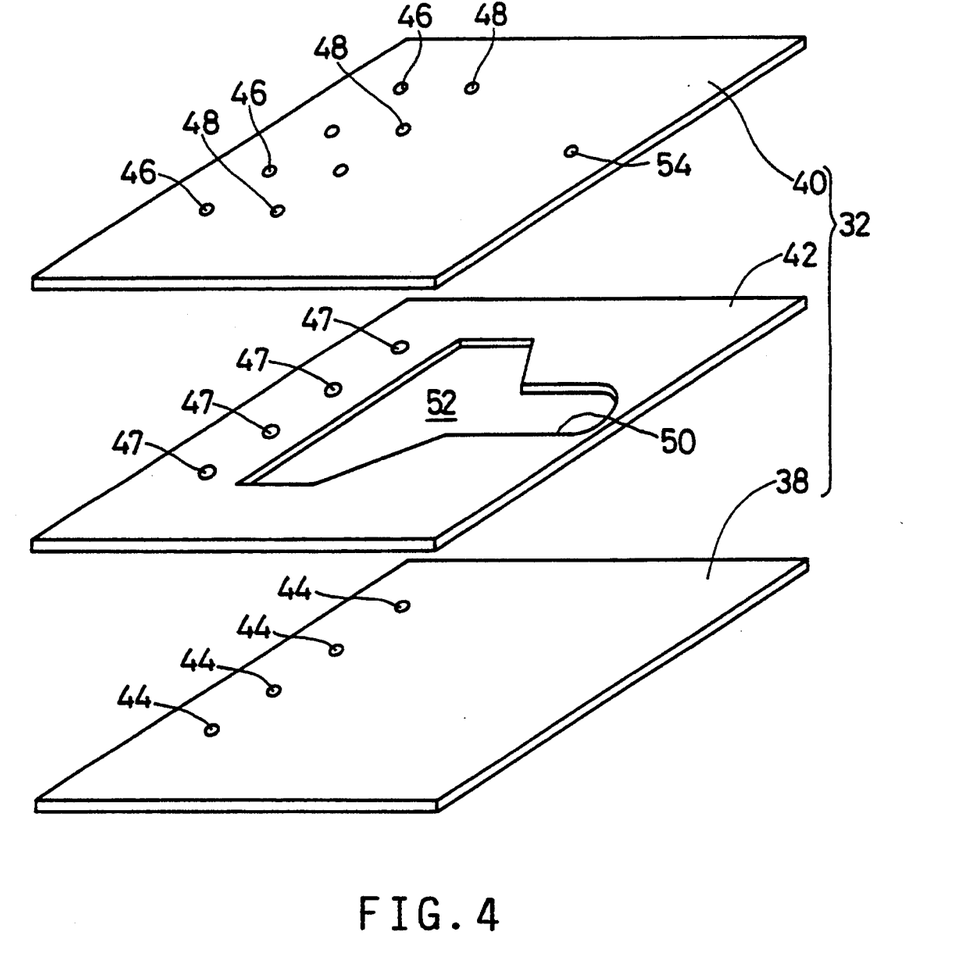
FIG. 4 is an exploded perspective view showing the structure of an ink nozzle member of the actuator unit of FIG. 3.

More specifically described, the orifice plate 40 of the ink nozzle member 32 has through-holes 46 and orifices 48 formed through the thickness thereof. The through-holes 46 and the orifices 48 are respectively aligned with the first communication holes 66 and the second communication holes 67 of the connecting plate 58 of the actuator portion 34. The orifice plate 40 further has a supply port 54 through which an ink is fed into an ink supply channel 52 which will be described. The channel plate 42 of the ink nozzle member 32 has through-holes 47 formed in alignment with respective through-holes 46 of the orifice plate 40. The channel plate 42 is formed with a window 50 which communicates with the orifices 48 and the supply port 54 of the orifice plate 40. The nozzle plate 38 of the ink nozzle member 32 has nozzles 44 formed through the thickness thereof for permitting jets of fine ink particles. The nozzles 44 are aligned with the respective through-holes 47 of the channel plate 42.

The nozzle plate 38, orifice plate 40 and channel plate 42 are superposed on each other and bonded together by a suitable adhesive, so as to form an integral structure of the ink nozzle member 32. In the thus formed ink nozzle member 32, the window 50 of the channel plate 42 is closed at its opposite openings by the nozzle plate 38 and the orifice plate 40, respectively, whereby an ink supply channel 52 is defined by the channel plate 42, nozzle plate 38 and orifice plate 40.

While the material for the plates 38, 40, 42 of the ink nozzle member 32 is not particularly limited, these plates 38, 40, 42 are preferably made of a plastic, or a metal such as nickel or stainless steel, which permits highly accurate formation of the nozzles 44 and orifices 48. Each of the orifices 48 is desirably tapered such that the diameter of the orifice 48 is reduced in the direction of the flow of the ink (i.e., in the direction from the ink supply channel 52 toward the pressure chambers 36), as shown in FIG. 3 by way of example, so as to function as a check valve for inhibiting the ink from flowing in the reverse direction.

The thus constructed ink nozzle member 32 is integrally bonded to the actuator portion 34 as described above by means of a suitable adhesive, so as to form each of many actuator units 30 of the ink jet print head. In the thus formed actuator unit 30, an ink material which is fed into the supply channel 52 through the supply port 54 is supplied to the pressure chambers 36 of the actuator portion 34 through the respective orifices 48 of the orifice plate 40 of the ink nozzle member 32, and is passed through selected pairs of the through-holes 46, 47 and jetted outwards from the corresponding nozzles 44, upon operation of the corresponding piezoelectric/electrostrictive elements 70 of the actuator 34.

The adhesive used for bonding the ink nozzle member 32 and the actuator portion 34 may be selected from various known adhesives, such as those of vinyl-type, acrylic-type and epoxy-type, or those containing polyamide, phenol, resorcinol, urea, melamine, polyester, furan, polyurethane, silicone, rubber, polyimyde and polyorefin, provided the selected adhesive is resistant to the ink material.

It is desirable in terms of production efficiency that the adhesive be in the form of a highly viscous paste or in the form of a sheet. It is more desirable to use a hot-melt type adhesive which requires a relatively short heating time, or an adhesive which is curable at room temperature. In particular, it is preferable to use an elastic epoxy adhesive, a silicone-contained adhesive or an epoxy-type adhesive containing silicone resin which can be applied by screen-printing, or a sheet-like, hot-melt type adhesive containing polyolefin or polyester, which permits punching of the adhesive sheet.

In the actuator unit 30 constructed as described above, the actuator 34 stably exhibits improved operating characteristics as described above so as to assure enhanced performance thereof as an ink pump, whereby the present print head actuator unit 30 offers excellent ink-jetting capability with high stability.

A sample of the actuator portion 34 illustrated in FIGS. 1 and 2 was produced, wherein nine pressure chambers 36 were formed within the substrate in a row, and two enclosed spaces corresponding to the respective two auxiliary windows 78 were formed within the substrate adjacent to the respective two outermost pressure chambers 36 located at the opposite ends of the row of the nine pressure chambers 36, so that the nine pressure chambers 36 are interposed by the two enclosed spaces. By applying a given voltage to the nine piezoelectric/electrostrictive elements 70 (Nos. 1-9) which correspond to the respective nine pressure chambers 36, the amount of flexural deformation was measured of each of the nine piezoelectric/electrostrictive elements 70, by using a laser Doppler measuring device. A comparative sample of actuator portion was produced, wherein the nine pressure chambers 36 were formed in a row within the substrate while the auxiliary windows 78 were not formed. Similarly, the amount of flexural deformation was measured of each of the nine piezoelectric/electrostrictive elements 70 (Nos. 1-9) corresponding to the respective nine pressure chambers 36 in this comparative sample of actuator portion. The results of measurement is indicated in the following TABLE 1.

TABLE 1

Amount of flexural deformation ($\mu$m) of each piezoelectric/electrostrictive element upon application of voltage

| element No. | actuator with auxiliary windows | actuator without auxiliary windows |
| --- | --- | --- |
| 1 | 0.29 | 0.18 |
| 2 | 0.30 | 0.31 |
| 3 | 0.29 | 0.33 |
| 4 | 0.31 | 0.29 |
| 5 | 0.31 | 0.32 |
| 6 | 0.32 | 0.33 |
| 7 | 0.29 | 0.30 |
| 8 | 0.31 | 0.30 |
| 9 | 0.31 | 0.17 |

As clearly understood from the above TABLE 1, in the actuator portion having the enclosed spaces corresponding to the two auxiliary windows 78 formed adjacent to the respective two outermost pressure chambers located at the opposite ends of the row of the nine pressure chambers 36, the average amount of flexural deformation of the nine piezoelectric/electrostrictive elements was 0.30 $\mu$m while the amount of flexural deformation of the two outermost elements (Nos. 1 and 9) corresponding to the two outermost pressure chambers 36 was in a range of 0.29–0.31 $\mu$m, which was substantially equal to the average amount of 0.30 $\mu$m. On the other hand, in the comparative sample of actuator portion without the enclosed spaces corresponding to the auxiliary windows 78, the average amount of flexural deformation of the nine elements was 0.28 $\mu$m while the amount of flexural deformation of the two outermost elements (Nos. 1 and 9) corresponding to the two outermost pressure chambers was in a range of 0.17–0.18 $\mu$m, which was considerably smaller than the average amount of 0.28 $\mu$m. Therefore, the results clearly show that the operating characteristics of the piezoelectric/electrostrictive elements deteriorated in the comparative sample of actuator portion without the enclosed spaces corresponding to the auxiliary windows.

While the present invention has been described in its preferred embodiment with a certain degree of particularity, it is to be understood that the invention is not limited to the details of the illustrated embodiment, but may be otherwise embodied with various changes, modifications and improvements without departing from the spirit and scope of the invention defined in the appended claims.

Figure 7:
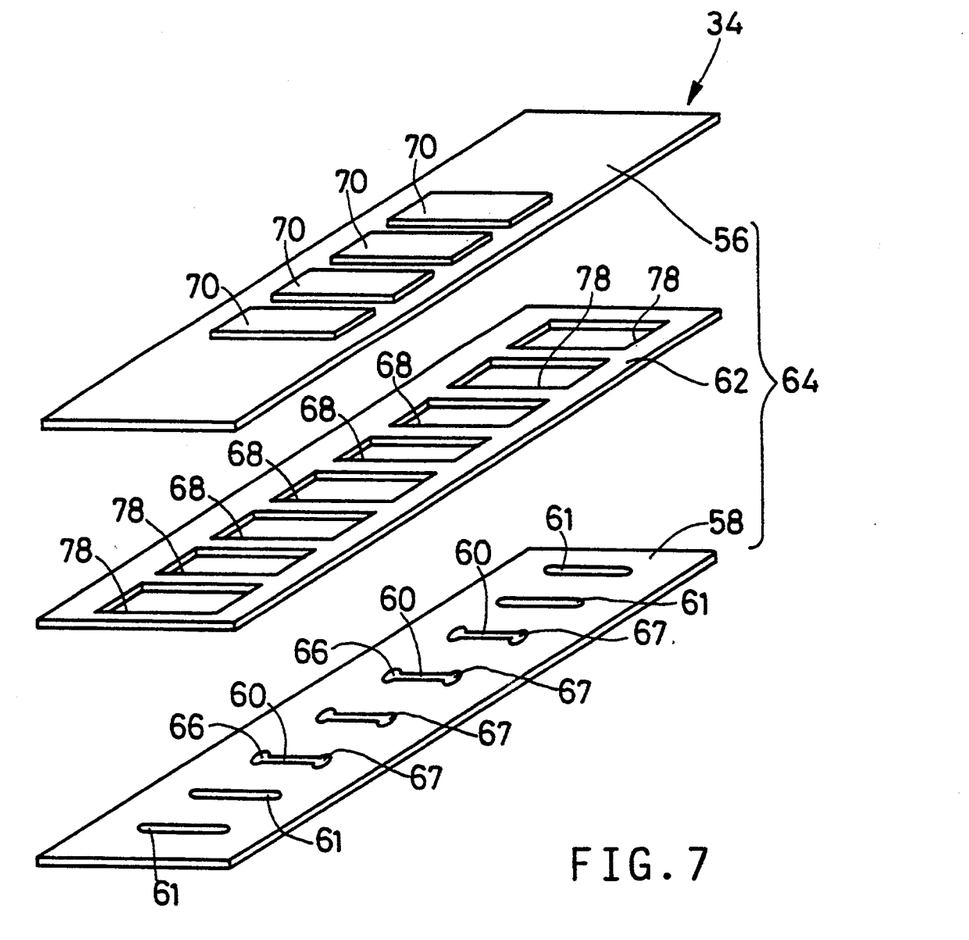
FIG. 7 is an exploded perspective view corresponding to that of FIG. 2, showing the actuator portion according to another embodiment of the present invention.

For instance, the construction of the present actuator unit 30 or actuator portion 34 is by no means limited to that of the illustrated embodiment. The principle of the present invention is also applicable to an actuator unit having the actuator portion 25 as shown in FIG. 5, wherein the ceramic substrate has a two-layer structure consisting of the closure plate and the spacer plate. Further, the principle of the invention may similarly be applied to an actuator unit whose ceramic substrate has a three-layer structure consisting of the closure plate, spacer plate and connecting plate without the slits 60. The numbers, positions and other parameters of the pressure chambers 36 and the piezoelectric/electrostrictive elements 70 of the actuator 34 are not limited to those of the illustrated embodiment, provided the pressure chambers 36 are formed within the substrate in a row, so as to be sandwiched by and between the enclosed spaces corresponding to the auxiliary windows 78. Although the two auxiliary windows 78 are formed adjacent to the respective two outermost pressure chambers 36 located at the opposite ends of the row in the illustrated embodiment, two or more auxiliary windows may be formed adjacent to each of the two outermost pressure chambers 36, as shown in FIG. 7.

Moreover, the construction and material of the ink nozzle member 32 are not limited to those of the illustrated embodiment. For instance, the whole or a part of the ink nozzle member 32 may be formed by injection molding, using synthetic resin or the like, or by other molding method. Furthermore, the positions, numbers and other parameters of the nozzles 44 and orifices 48 formed in the ink nozzle member 32 may suitably be changed.

The actuator unit constructed according to the present invention may be used as an ink pump for various ink jet print heads as described above, and may also be used for microphones, piezoelectric loudspeakers, sensors, vibrators, filters and other components or devices.

What is claimed is:

1. A piezoelectric/electrostrictive actuator comprising:

a ceramic substrate in which pressure chambers are formed, said ceramic substrate including a spacer plate having a plurality of windows which provide said pressure chambers, said plurality of windows being formed in a row in a longitudinal direction of said spacer plate, and a closure plate superposed on one of opposite major surfaces of said spacer plate, for closing one of opposite openings of each of said windows, said spacer plate and said closure plate being formed from respective ceramic green sheets which are laminated on each other and fired into an integral structure as said ceramic substrate; and piezoelectric/electrostrictive elements which are disposed on respective portions of said closure plate which partially define said pressure chambers, respectively, said elements being energized to cause deformation of said respective portions, so as to change pressure levels of the corresponding pressure chambers, each of said piezoelectric/electrostrictive elements comprising a pair of electrodes and a piezoelectric/electrostrictive layer, which are formed by a film-forming method on an outer surface of said closure plate, such that said piezoelectric/electrostrictive layer is interposed between said pair of electrodes, wherein the improvement comprises:

said spacer plate of said ceramic substrate having auxiliary windows formed adjacent to respective two outermost windows which are located at opposite ends of the row of said plurality of windows of said spacer plate, such that said auxiliary windows sandwich the row of said plurality of windows, said auxiliary windows providing enclosed spaces within said ceramic substrate such that said enclosed spaces are formed adjacent to respective two outermost pressure chambers which are located at opposite ends of a row of the pressure chambers, each of said enclosed spaces being partially defined by portions of said closure plate on which said piezoelectric/electrostrictive elements are not disposed.

2. A piezoelectric/electrostrictive actuator according to claim 1, wherein said ceramic substrate includes said closure plate, said spacer plate and a connecting plate which are superposed on each other to provide an integral structure of said ceramic substrate.

3. A piezoelectric/electrostrictive actuator according to claim 2, wherein said connecting plate has pairs of first and second communication holes formed through the thickness thereof and slits for connecting said first and second communication holes of each pair.

4. A piezoelectric/electrostrictive actuator according to claim 3, wherein each pair of said first and second communication holes are aligned with the corresponding one of said pressure chambers, as viewed in a plane of said ceramic substrate.

5. A piezoelectric/electrostrictive actuator according to claim 2, wherein said connecting plate has additional slits at the portions thereof which correspond to said auxiliary windows of said spacer plate.

6. A piezoelectric/electrostrictive actuator according to claim 1, wherein said ceramic substrate is comprise of alumina or zirconia.

7. A piezoelectric/electrostrictive actuator according to claim 1, wherein said closure plate has a thickness of not larger than 50 μm.

8. A piezoelectric/electrostrictive actuator according to claim 1, wherein said spacer plate has a thickness of not smaller than 10 μm.

9. A piezoelectric/electrostrictive actuator according to claim 2, wherein said connecting plate has a thickness of not smaller than 30 μm.

10. A piezoelectric/electrostrictive actuator according to claim 1, wherein said piezoelectric/electrostrictive element has a thickness of not larger than 100 μm.

11. A piezoelectric/electrostrictive actuator according to claim 1, wherein each of said pair of electrodes has a thickness of not larger than 20 μm.

12. A piezoelectric/electrostrictive actuator according to claim 1, wherein said piezoelectric/electrostrictive layer has a thickness of not larger than 50 μm.

13. A piezoelectric/electrostrictive actuator according to claim 1, which is used as each of a plurality of actuator units on an ink jet print head, and which further comprises an ink nozzle member including an orifice plate having orifices and through-holes, a channel plate having a window formed therethrough and through-holes formed in alignment with said through-holes of said orifice plate, and a nozzle plate having nozzles, said orifice plate, said channel plate and said nozzle plate being superposed on each other and bonded together so that said window of said channel plate is closed by said orifice plate and said nozzle plate so as to form an ink supply channel through which an ink flows into said pressure chambers of said actuator via the respective orifices of said orifice plate, said ink being jetted from said pressure chambers through said nozzles of said nozzle plate, via said through-holes of said orifice plate and said channel plate, when said elements corresponding to said pressure chambers are selectively energized.

* * * * *